United States Patent
Nakamura et al.

(10) Patent No.: US 6,396,701 B1
(45) Date of Patent: May 28, 2002

(54) SEMICONDUCTOR UNIT AND COOLING DEVICE

(75) Inventors: Naoaki Nakamura; Yasuo Kawamura, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/665,596

(22) Filed: Sep. 19, 2000

(30) Foreign Application Priority Data

Nov. 12, 1999 (JP) ............................. 11-322960

(51) Int. Cl.[7] ................................................ H05K 7/20
(52) U.S. Cl. ........................ 361/706; 174/252; 361/719
(58) Field of Search ................................. 264/104, 105, 264/108; 165/80.3, 185; 174/16.3, 252, 52.2; 257/707, 713, 720, 722–724; 361/703–706, 713, 717–719

(56) References Cited

U.S. PATENT DOCUMENTS

| | | | | |
|---|---|---|---|---|
| 4,730,665 A | * | 3/1988 | Cutchaw | 165/80.4 |
| 4,771,365 A | * | 9/1988 | Cichocki et al. | 361/705 |
| 5,168,926 A | * | 12/1992 | Watson et al. | 165/185 |
| 5,513,070 A | * | 4/1996 | Xie et al. | 361/700 |
| 5,614,043 A | * | 3/1997 | Ritland et al. | 156/89 |
| 5,724,729 A | * | 3/1998 | Sherif et al. | 29/840 |
| 5,835,355 A | * | 11/1998 | Dordi | 361/760 |
| 5,907,474 A | * | 5/1999 | Dolbear | 361/705 |
| 5,990,550 A | * | 11/1999 | Umezawa | 257/712 |
| 6,183,874 B1 | * | 2/2001 | Yamagata | |
| 6,188,582 B1 | * | 2/2001 | Peter | |
| 6,212,073 B1 | * | 4/2001 | Yamaguchi | |
| 6,275,381 B1 | * | 8/2001 | Edwards et al. | 361/717 |

FOREIGN PATENT DOCUMENTS

| JP | 04-85861 | 3/1992 |
|---|---|---|
| JP | 04-359496 | 12/1992 |

* cited by examiner

Primary Examiner—Gerald Tolin
(74) Attorney, Agent, or Firm—Armstrong, Westerman & Hattori, LLP

(57) ABSTRACT

A semiconductor unit is provided, which includes a substrate, a plurality of semiconductor components loaded on the substrate, and a cooling device provided above the semiconductor components. A flat-bottomed dent, slightly smaller than the semiconductor component, is provided on a compound injection unit of the cooling device, and an injection hole for injecting a compound is formed in communication with the dent. The compound is injected through the injection hole into the dent and into a clearance provided between the compound injection unit and the semiconductor component, thus forming a compound layer in between the compound injection unit and the semiconductor component.

10 Claims, 7 Drawing Sheets

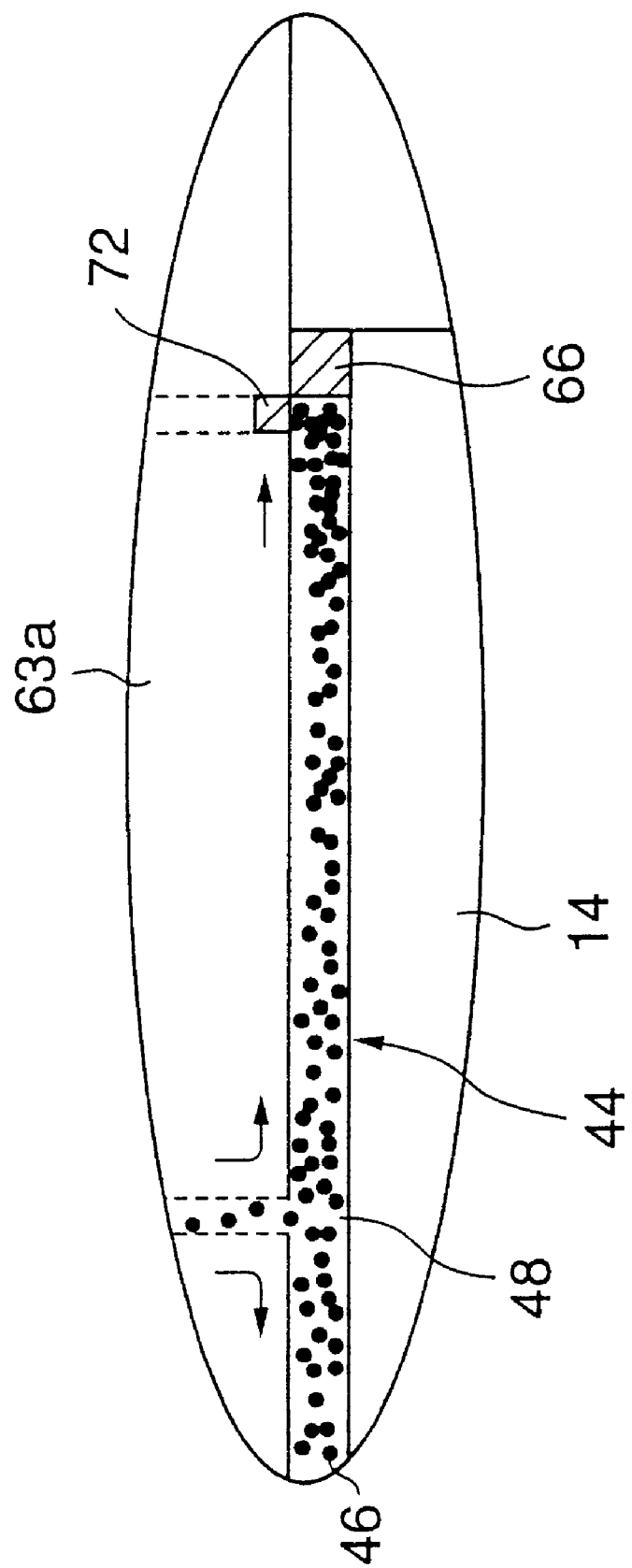

SEMICONDUCTOR UNIT AND COOLING DEVICE

BACKGROUND OF THE INVENTION

1. Field of the Invention

The present invention relates to a semiconductor unit, a cooling device used in the unit, and manufacturing methods for the semiconductor unit and the cooling device. In particular, the present invention relates to a semiconductor unit including a substrate loaded with a plurality of semiconductor components, a cooling device used in the unit provided above the components, and manufacturing methods of both the semiconductor unit and the cooling device.

2. Description of the Related Art

To realize high-density mounting of a plurality of semiconductor components in a semiconductor unit with Multi-Chip Module (MCM), it is a common practice to create many bumps (connecting terminals) on nearly the whole connecting surface of the semiconductor components and then load the semiconductor components on the substrate.

In this case, since the semiconductor components are high-density mounted, heat generated in each semiconductor component becomes relatively high. Therefore, it is required to efficiently radiate the heat.

In order to radiate the heat, conventionally, for example, a method of collectively covering the exposed surface of each semiconductor component with a metallic cooling member is used. In the case of air cooling the cooling member so that heat is conducted away from the semiconductor component, the cooling is done through ventilation by placing many fins on the cooling member. On the other hand, when a more efficient method of radiation is required, liquid cooling is typically performed by circulating coolant inside the cooling member. In general, compared to the air cooling, in the case of the liquid cooling, the expense for the cooling member becomes costly and also miniaturization of the cooling member is prevented.

In either case of implementing the above-mentioned air cooling method or the liquid cooling method, it is necessary to closely connect the semiconductor component, which is the generator of the heat, with the cooling member so as to attain a thermal conduction between the two, in order to efficiently radiate the heat. However, it is not easy to attain a good adhesion by simply connecting the semiconductor component with the cooling member.

Therefore, in order to eliminate any clearance between the semiconductor component and the cooling member that may cause a resistance to the heat transfer, it is in common practice to apply a thermally conductive compound on the exposed surface of the semiconductor component to connect the component with the cooling member. In this case, for example, the compound is applied individually to each semiconductor component with a syringe-like compound injection device by controlling the amount of the compound by injection pressure and injection time.

However, in the case of the method of applying the compound described above, it is tedious to evenly control the amount of the compound applied to each semiconductor component. Also if the amount of the compound is unevenly applied to an individual component, the adhesion between the semiconductor component and the cooling member may be inadequate. Further, it is necessary to adjust the amount of the compound applied to each component depending on dimensional differences between semiconductor components within the same lot or positional differences caused during assembling of the semiconductor components to the substrate, which adjustment is also tedious with the conventional method.

In addition, when the amount of the compound applied to the semiconductor component becomes excessive or the liquidity of the matrix component of the compound is too high, mainly the matrix component flows out from peripheral areas of the semiconductor component and stains the substrate and bumps. In this case, metal filler in the compound may cause a short circuit or malfunction of the semiconductor unit.

SUMMARY OF THE INVENTION

A general object of the present invention is to provide a semiconductor unit, a cooling device, and methods for both the semiconductor unit and cooling device in which the above disadvantages are eliminated.

Another and more specific object of the present invention is to provide a semiconductor unit including semiconductor components and a cooling member connected together to secure thermal conductivity which surpasses the related art in heat radiation and also has fewer problems such as short circuits which may be caused by compound stains, to provide a cooling device used in the semiconductor unit, and to provide suitable manufacturing methods for the semiconductor unit and the cooling device.

The above objects of the present invention are achieved by a semiconductor unit comprising: a substrate; a plurality of semiconductor components loaded on the substrate; and a cooling device comprising a first hole for injecting a compound to connect the cooling device with the semiconductor components.

The above objects of the present invention are also achieved by a cooling device comprising: a member thermally coupled with semiconductor components; and a first hole for injecting a compound to connect the cooling device with the semiconductor components.

The above objects of the present invention are also achieved by a manufacturing method for a semiconductor unit comprising a plurality of semiconductor components loaded on a substrate and a cooling device arranged above the semiconductor components, comprising steps of: (a)injecting a compound through an injection hole on the cooling device; (b)forming a compound layer in between the semiconductor component and the cooling device; and (c)connecting the semiconductor component with the cooling device by the compound layer.

The above-mentioned objects of the present invention are also achieved by a manufacturing method for a cooling device arranged above semiconductor components loaded on a substrate, comprising the steps of: forming an injection hole in a member of the cooling device for injecting a compound; and injecting the compound through the injection hole so that the semiconductor components and the member of the cooling device are fixed together.

BRIEF DESCRIPTION OF THE DRAWINGS

FIG. 1B is a top view of the CPU unit;

FIG. 5A and FIG. 5B describe a CPU unit, a cooling device and manufacturing methods for the CPU unit and the cooling device of a third embodiment of the present invention, wherein FIG. 5A is a sectional view taken along the line (a)—(a) of the CPU unit in FIG. 5B, and FIG. 5B is a top view of the CPU unit;

FIG. 6 is a partial enlarged view of a CPU unit of a fourth embodiment of the present invention.

DESCRIPTION OF THE PREFERRED EMBODIMENTS

A description of preferred embodiments of the present invention related to the semiconductor unit, the cooling device and the manufacturing methods for the semiconductor unit and the cooling device, will now be given using examples of a CPU (central processing unit) unit with references to figures provided.

Figures 1A, 1B:
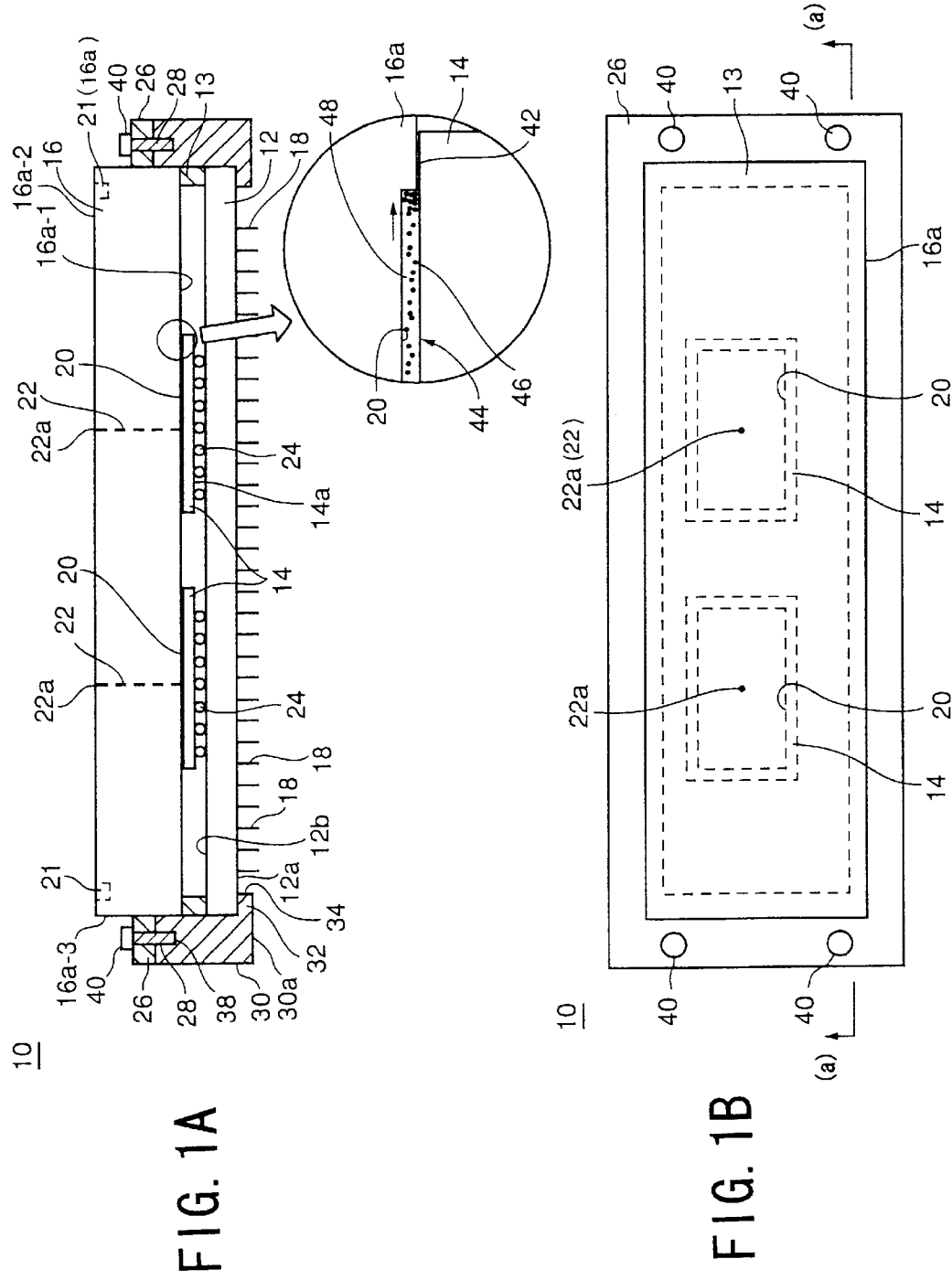
FIG. 1A and FIG. 1B describe a CPU unit of a first embodiment of the present invention, where in FIG. 1A is a sectional view taken along the line (a)—(a) of the CPU unit in FIG. 1B.

First, a description will be given with reference to FIG. 1 of a CPU unit, a cooling device and their manufacturing methods related to a first embodiment of the present invention.

The CPU unit 10 includes a substrate 12, a plurality of semiconductor components 14 loaded on the substrate 12 and a cooling device 16 provided above the semiconductor components 14.

On a lower surface 12a of the substrate 12, a plurality of IO pins 18 are provided. When the CPU unit 10 is mounted on a later explained mother-board 82 (shown in FIG. 7), the IO pins 18 electrically connect the CPU unit 10 and the mother-board 82.

A lower surface 14a of the semiconductor component 14 is provided with solder bumps (connecting terminals) 24 which electrically connect the semiconductor 14 with the substrate 12. On the periphery of an upper surface 12b of the substrate 12, a frame-shaped spacer (separating member) 13 is provided to maintain a certain distance between the cooling device 16 and the semiconductor component 14.

Figure 2:
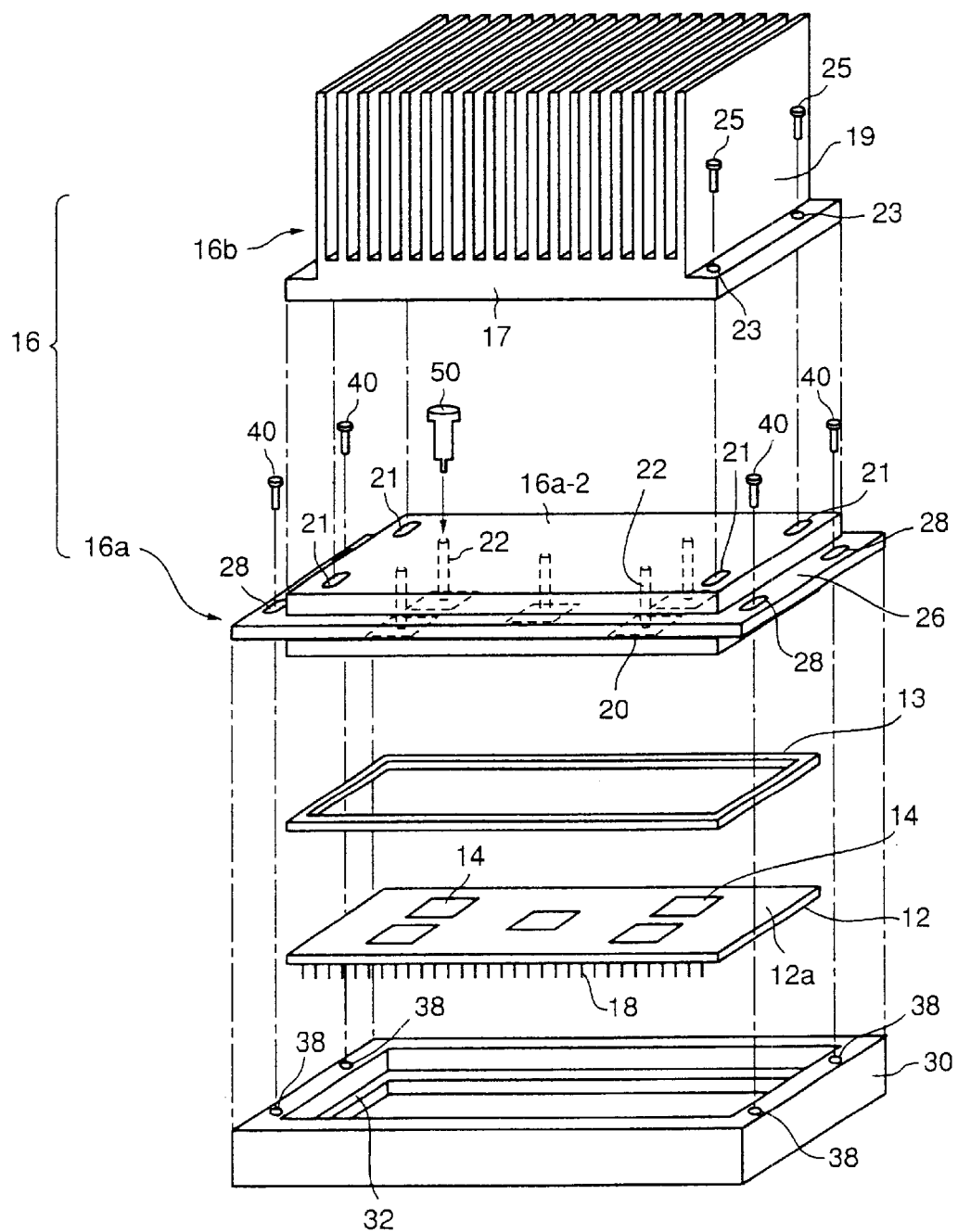
FIG. 2 is an assembly exploded view of the CPU unit of the first embodiment of the present invention shown in FIGS. 1A and 1B.

The cooling device 16 includes a compound injection unit 16a shown in FIG. 1 and detachable radiation fins (radiation unit) 16b (shown in FIG. 2). The compound injection unit 16a has a rectangular parallelepiped form and includes flat-bottomed dents 20 which are slightly smaller than the semiconductor components 14. The dents 20 are provided on a lower surface 16a-1 of the compound injection unit 16a facing the upper surface 12b of the substrate 12. Each dent 20 has a hole 22 used to inject a thermally conductive compound 44. Each hole 22 has an opening 22a on an upper surface 16a-2 of the compound injection unit 16a. A protruding portion 26 is provided on the periphery of side surfaces 16a-3 of the compound injection unit 16a. Screw holes 28, through which screws 40 are to be screwed, are provided on two sides of the protruding portion 26. In addition, screw holes 21 are provided on both ends of the upper surface 16a-2 of the compound injection unit 16a to fix the radiation fins 16b to the injection unit 16a.

A frame body 30 surrounds the substrate 12. The IO pins 18 attached to the substrate 12 are maintained in the air within a space provided by a protruding portion 32 extending under the frame body 30. The IO pins 18 are arranged so as to face an opening 34 of an underside 30a of the frame body 30. The underside 30a of the frame body 30 and tips of the IO pins 18a are positioned almost on the same level. Screw holes 38 are provided on two opposite sides of the frame body 30. The compound injection unit 16a is fixed onto the frame body 30 by the screws 40 being screwed through the screw holes 28 and 38.

The compound 44 through the holes 22 to fill the dents 20 and a clearance (a minute opening) 42 approximately 20 $\mu$m wide between the compound injection unit 16a and the semiconductor component 14, thus forming the compound layer 44a. For example, the compound 44 is a combination of a metal filler 46 made up of 90 parts by weight of zinc oxide having a mean particle size of 25 $\mu$m and a solvent 48 of 10 parts by weight of silicon oil, and attains thermal conductivity. Most of the filler 46 having a mean particle size of 25 $\mu$m stays in the dent 20 as it is prevented from entering the 20 $\mu$m-clearance 42.

With the CPU unit 10 of the first embodiment of the present invention, constructed as described above, even if there are dimensional differences between semiconductor components within the same lot or positional difference caused during assembling of the semiconductor components to the substrate, the semiconductor components 14 and the compound injection unit 16a are certainly connected by the compound 44 to secure thermal conductivity and therefore efficient heat radiation. Compared to the conventional art of connecting the cooling members after individually applying the compound to each semiconductor component, there is a smaller possibility of compound flowing out onto the substrate 12 and therefore there are fewer short circuits or malfunctions caused by the compound staining of the substrate 12 or bumps 24. Also the compound injection unit described above is applicable to the CPU unit 10.

A description will now be given of the manufacturing methods of the above-mentioned CPU unit 10 and compound injection unit 16a with reference to FIG. 2.

The substrate 12 is prepared by loading a plurality of semiconductor components 14 with solder bumps 24 on the upper surface 12b of the substrate 12 and attaching IO pins 18 to the lower surface 12a of the substrate 12.

The compound injection unit 16a is prepared by, first, machining the protruding portion 26 from a rectangular parallelepiped member made of copper material. Then, the protruding portion 26 is tapped to form. screw holes 28. Then, by machining, a plurality of dents 20, with approximate dimensions of, for example, 18 mm×18 mm×0.1 mm, are formed on the lower surface 16a-1 of the compound injection unit 16a. The size of these dents 20 is slightly smaller than the approximate size of 20 mm×20 mm, for example, of the semiconductor components 14. The dents 20 are positioned so as to coincide with the positions of the semiconductor components 14 on the substrate 12. Finally, a hole 22 of 1-mm diameter is drilled between the bottom surface of each dent 20 and the upper surface 16a-2.

The rectangular frame body 30, made of, for example, a metallic material which has a similar coefficient of thermal expansion to that of the substrate 12, is machined to create the protruding portion 32 at the bottom of the frame body 30. The upper opening of the frame body 30 has slightly larger inner dimensions as compared to the outer dimensions of the substrate 12. Finally, the screw holes 38 are provided on the upper surface of two sides of the frame body 30.

The frame-shaped spacer 13 is formed of, for example, a metallic material which has a similar coefficient of thermal expansion to that of the substrate 12. The height of the spacer 13 (shown in FIG. 1A) is machined to be little larger than the height of the semiconductor component 14 with the solder bumps 24.

A description will now be given of the assembling method of the CPU unit 10 using the members described above.

The frame body 30 is placed on a fixed platform not shown in the figures and the substrate 12, loaded with the semiconductor components 14, is placed inside the frame body 30 with the IO pins 18 facing downwards. Then the spacer 13 is placed above the substrate 12 so as to form a clearance over the semiconductor components 14. The compound injection unit 16a, with the dents 20 facing downwards, is arranged on top of the semiconductor components 14. At this time, the compound injection unit 16a is positioned so as to include the above-mentioned clearance 42 above the semiconductor component 14 created by the spacer 13. The screws 40 are then screwed through the screw holes 28 and 38 to fix the frame body 30 to the compound injection unit 16a. Accordingly, the CPU unit 10 is constructed and ready for the injection of the compound 44.

Figure 3:
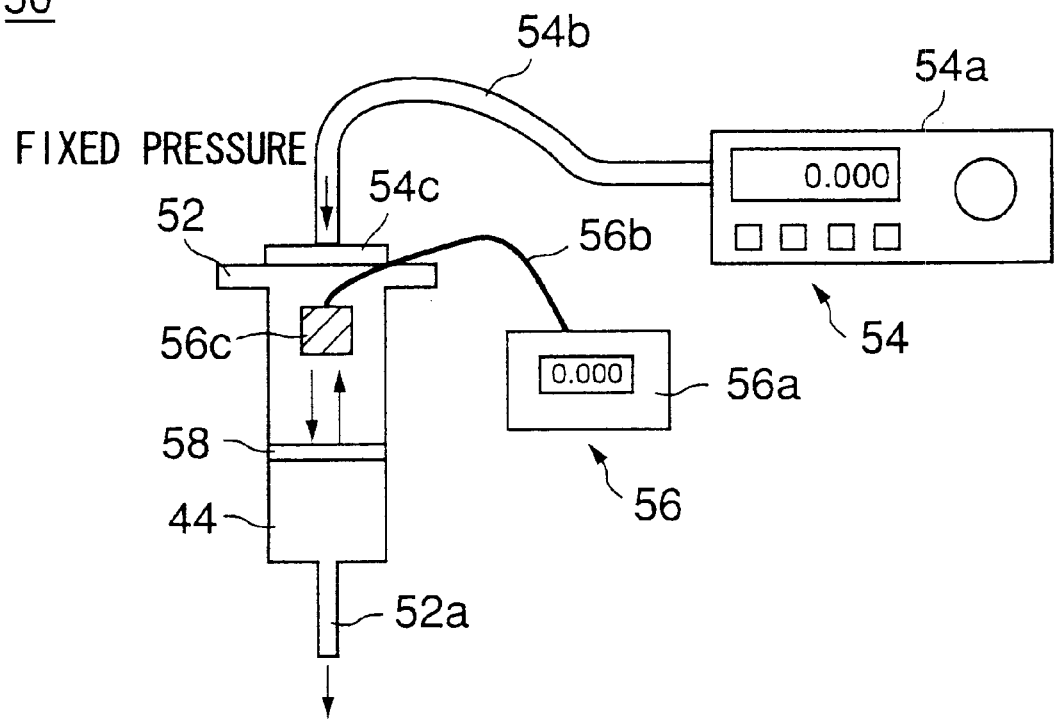
FIG. 3 is a drawing of a compound injection device of the first embodiment of the present invention.

A compound injection device 50, used to inject the compound 44, is shown in FIG. 3.

The compound injection device 50 includes a syringe 52, a dispenser 54 and an injection rate monitor 56.

The cylinder-shaped syringe 52 has a short pillar-shaped piston 58 movable in a vertical direction and an injection needle 52a at its bottom. The dispenser 54 is used, for example, to push the piston 58 with a fixed pressure by introducing a pressurized substance such as air inside the syringe 52 and maintaining the substance at the fixed pressure. A tube 54b is coupled to a main body 54a of the dispenser 54 at one end and is fitted with a flange 54c at the opposite end. The flange 54c blocks the upper opening of the syringe 52. By measuring the amount of compound 44 left in the syringe 52, the injection rate monitor 56 measures the rate of injection of the compound 44 from the compound injection device 50. One end of a signal conductor 56b coupled to a main body 56a of the injection rate monitor 56 connects to a laser displacement meter 56c provided inside the syringe 52.

The compound injection device 50 is prepared when the appropriate amount of compound 44 is filled in the syringe 52 through the tube 54b and blocked by the flange 54c. When injecting the compound 44, the dispenser 54 fixes the pressure of the pressurized substance such as air which is pumped into the syringe 52 through the tube 54b. By doing so, the piston 58 is pressed downwards and the compound 44 is gradually discharged through the injection needle 52a. The laser displacement meter 56c detects the displacement of the piston 58 and signals indicating the displacement are sent to the main body 56a of the injection rate monitor 56 to define the injection rate. When the discharging pressure of injection needle 52a rises, the downward speed of the piston 58 drops accordingly since the inside of the syringe 52 is maintained at a fixed pressure. The injection rate monitor 56 defines the change in the downward speed.

The injection needle 52a of the compound injection device 50 is inserted into each of the injection holes 22 of the compound injection unit 16a.

The compound 44 with the metal filler 46 evenly dispersed in the solvent 48 reaches the dents 20 through the injection holes 22. On the other hand, residual gas in the holes 22 and the dents 20 is discharged to the outside via the clearance 42 between the compound injection unit 16a and the semiconductor components 14. In addition, when the compound 44 reaches the clearance 42, the solvent 48 with the metal filler 46 having a smaller particle size than the 20-$\mu$m clearance. 42 is discharged to the outside. Accordingly, the remaining metal filler 46 gradually accumulates at the entrance of the clearance 42 and eventually blocks the entrance, as shown in the enlarged section of FIG. 1A. When the entrance of the clearance 42 is blocked with the metal filler 46, the discharging pressure of the compound injection device 50 suddenly rises, which indicates that the compound 44 has completely filled the dent 20.

Lastly, the radiation fins 16b are placed above the compound injection unit 16a.

The radiation fins 16b include a plurality of fins 19 arranged on a flat portion 17 facing the surface of the compound injection unit 16a. In addition, the screw holes 23 are provided on two opposite ends of the flat portion 17. After applying the compound 44 on the surface 16a-2 of the compound injection unit 16a, the radiation fins 16b are fixed to the compound injection unit 16a by screwing screws 25 through the screw holes 23 and 21. Thus, the compound injection unit 16a and the radiation fins 16b are integrated.

By applying the manufacturing methods described above, the CPU unit 10 is completed.

According to the manufacturing methods of the CPU unit 10 and the compound injection unit 16a, it is possible to acquire the CPU unit 10 with improved thermal conductivity by flowing out an appropriate amount of solvent 48 that does not damage the substrate 12 or bumps 24, thus resulting in a higher filling density. In this case, by properly adjusting the mean particle size of the metal filler 46 and the size of the above-mentioned clearance 42, it is possible to adjust the amount of the metal filler 46, discharging from the clearance 42.

Yet, in the first embodiment of the present invention, the compound injection device 50 is designed to inject the compound individually into the injecting holes 22. However, the present invention is not limited to the above-described example. It is possible to efficiently operate the injection process by simultaneously injecting the compound 44 through the plurality of holes 22 formed according to the plurality of semiconductor components 14 loaded on the substrate 12.

Figure 4:
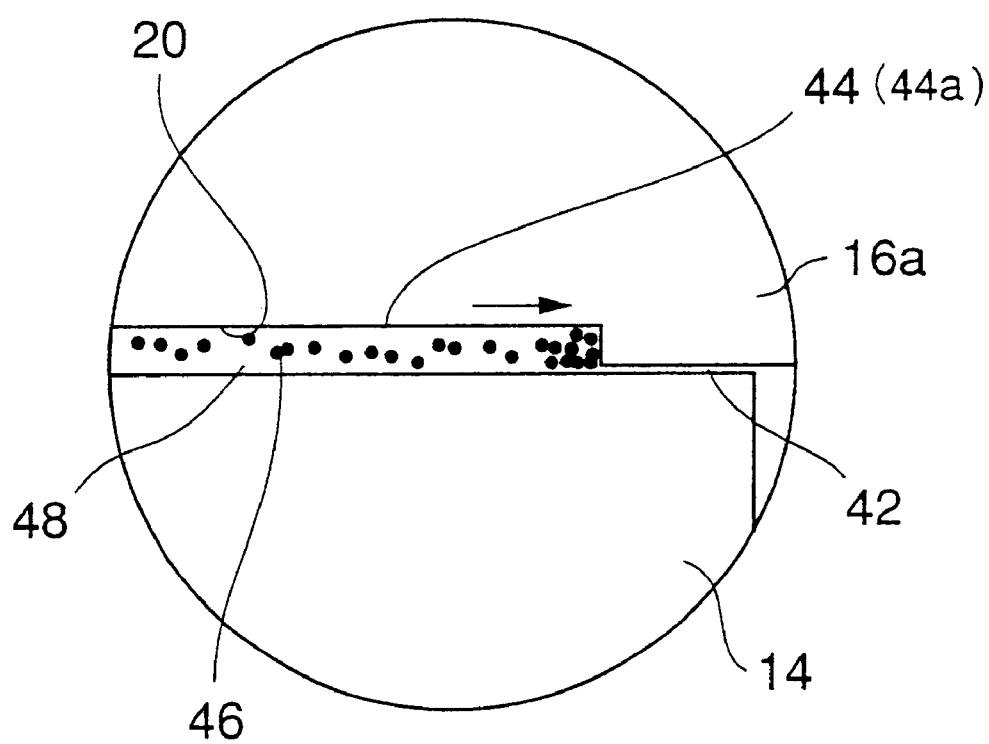
FIG. 4 is a partial enlarged view of a CPU unit of a second embodiment of the present invention.

A description will now be given of a CPU unit and a manufacturing method of the CPU unit of a second embodiment of the present invention with reference to FIG. 4.

The CPU unit 60 of the second embodiment of the present invention basically has the same composition as the CPU unit 10 of the first embodiment of the present invention, but differs in that the clearance 42 between the semiconductor component 14 and the compound injection unit 16a is even smaller than that of the first embodiment of the present invention. For example, whereas the clearance 42 in the first embodiment of the present invention had a width of an approximately 20 $\mu$m, the clearance in the second embodiment of the present invention has, for example, a width of approximately 10 $\mu$m.

According to the CPU unit 60 and the manufacturing method of the CPU unit 60 of the second embodiment of the present invention, there is a reduced possibility of the metal filler 46 with the mean particle size of 25 $\mu$m flowing out from the clearance 42. Therefore it is possible to efficiently and economically inject the compound 44, and to obtain the CPU unit 60 with improved thermal conductivity. Even if the dimensional differences between semiconductor components 14 within the same lot or the positional differences caused during the assembling of the semiconductor components 14 the substrate are as large as ±5 $\mu$m, vertically, it is possible to sufficiently prevent the metal filler 46 from flowing out from the clearance 42 since an even smaller clearance 42 than that of the first embodiment is provided.

Figures 5A, 5B:
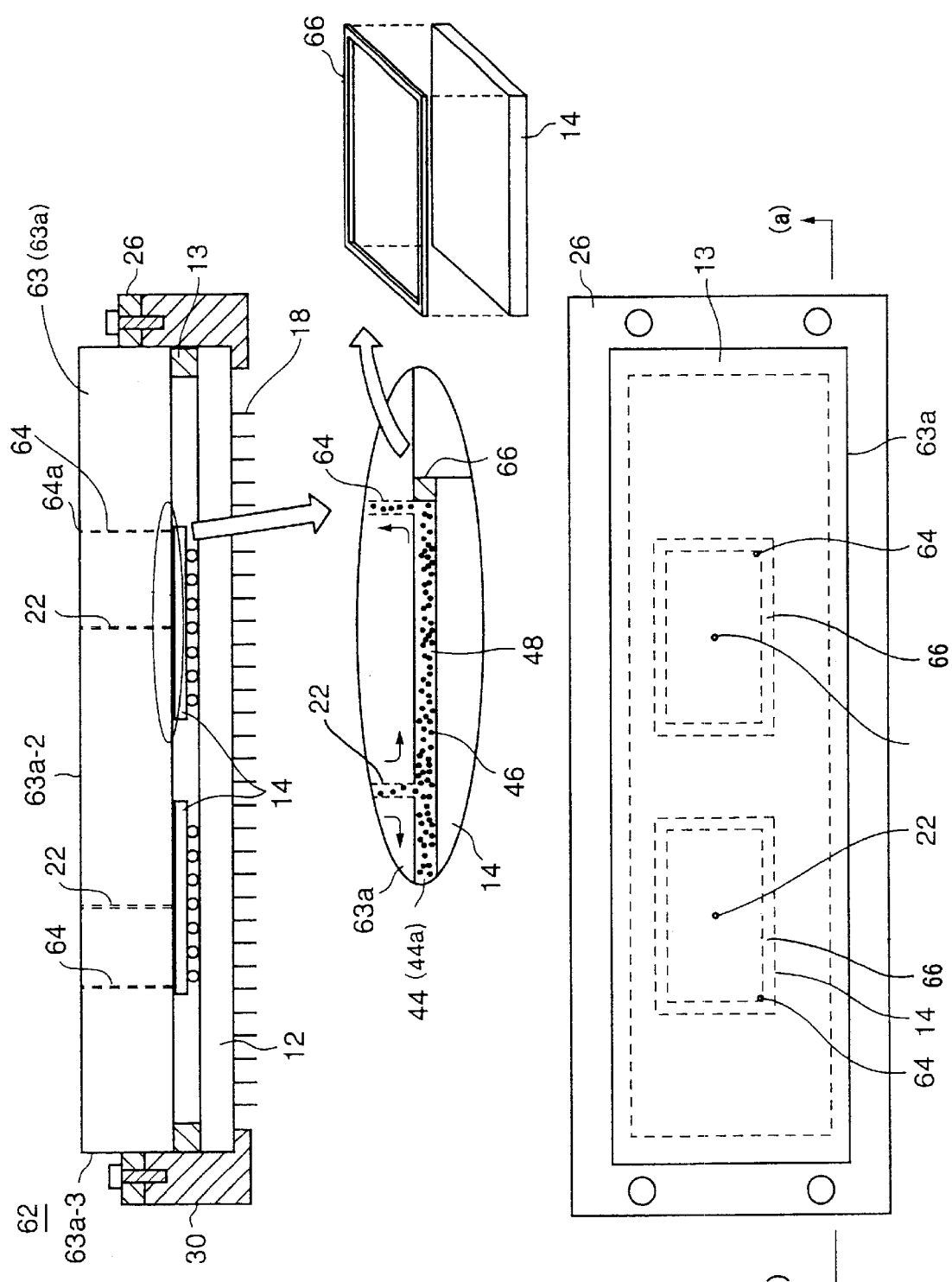

Descriptions will now be given of a CPU unit 62, and a cooling device 63 (compound injection unit 63a) of a third embodiment of the present invention and methods of manufacturing the CPU unit 62 and the cooling device 63, with reference to FIG. 5.

Basically, the third embodiment of the present invention has the same composition as the first embodiment of the present invention. Therefore, in FIG. 5, the same reference numbers will be used for the same components as in the first embodiment of the present invention and a detailed description of the components will be omitted.

The CPU unit 62 of the third embodiment of the present invention is different from the CPU unit 10 of the first embodiment of the present invention in two main ways.

First, the compound injection unit 63a further includes a discharging hole 64 in communication with the space between the compound injection unit 63a and the semiconductor component 14, besides the injection hole 22. The discharging hole 64 has an opening 64a on the surface 63a-2 of the compound injection unit 63a, similarly to the injection hole 22. However, the opening 64a may be provided on the side of the compound injection unit 63a. The discharging hole 64 has a diameter of approximately 1 mm. Also, the compound injection unit 63a is not provided with the dent 20 as in the case of the compound injection unit 16a.

Second, a frame-shaped outflow prevention spacer (separation member) 66 is provided around the outer periphery of the upper surface of the semiconductor component 14. The outflow prevention spacer 66 is made of materials such as resin that do not pass the filler, and the height of the spacer 66 (shown in a vertical direction in FIG. 5A) is, for example, approximately 50 $\mu$m. In the case of the CPU unit 62, the outflow prevention spacer 66 is provided, as an alternative to the spacer 13 of the CPU unit 10, to position the interval between the compound injection unit 63a and semiconductor component 14. In this case, the compound layer 44 is formed in the space provided by the compound injection unit 63a, semiconductor component 14 and the outflow prevention spacer 66. Also when the compound injection unit 63a is attached to the outflow prevention spacer 66, the spacer 66 is provided so as to surround both the injection hole 22 and the discharging hole 64 and restricts the outflow of the compound 44, similarly to the clearance 42 in the CPU unit 10. Therefore, the damage to the substrate 12 and bumps 24 with the compound stains is completely prevented.

According to the CPU unit 62 of the third embodiment of the present invention, the outer periphery of the space created by the compound injection unit 63a and the semiconductor component 14 to form the compound layer 44a is blocked by the outflow prevention spacer 66. As a result, residual gas and solvent are discharged from the discharging hole 64. Therefore the compound 44 does not flow out to the substrate 12 and it is possible to obtain the CPU unit with no inconveniences such as short circuits or malfunctions which may be caused with the compound stains.

When a porous material is used for the spacer 66 instead of providing discharging holes 64, it is possible to discharge the solvent 48 almost without the metal filler 46 by properly setting the diameter of the holes of the porous material.

A description will now be given of a CPU unit 70 of a fourth embodiment of the present invention and a manufacturing method for the CPU unit 70 with reference to FIG. 6.

The CPU unit 70 differs from the CPU unit 62 of the third embodiment of the present invention in that a filter 72 is provided at the entrance of the discharging hole 64. The filter 72 is, for example, made up of 5 $\mu$m-diameter resin material and therefore is able to capture the metal filler 46 of a particle size more than 10 $\mu$m.

According to the fourth embodiment of the present invention, since the filter 72 captures the metal filler 46 and only the residual gas and solvent 48 are discharged from the discharging hole 64, it is possible to efficiently and economically inject the compound 44 and obtain the CPU unit 70 with further improved thermal conductivity.

In addition, if the filter 72 is provided at the exit rather than the entrance of the discharging hole 64, the hole 64 will be filled with the metal filler 46, which improves the thermal conductivity of the CPU unit 70 even further.

Figure 7:
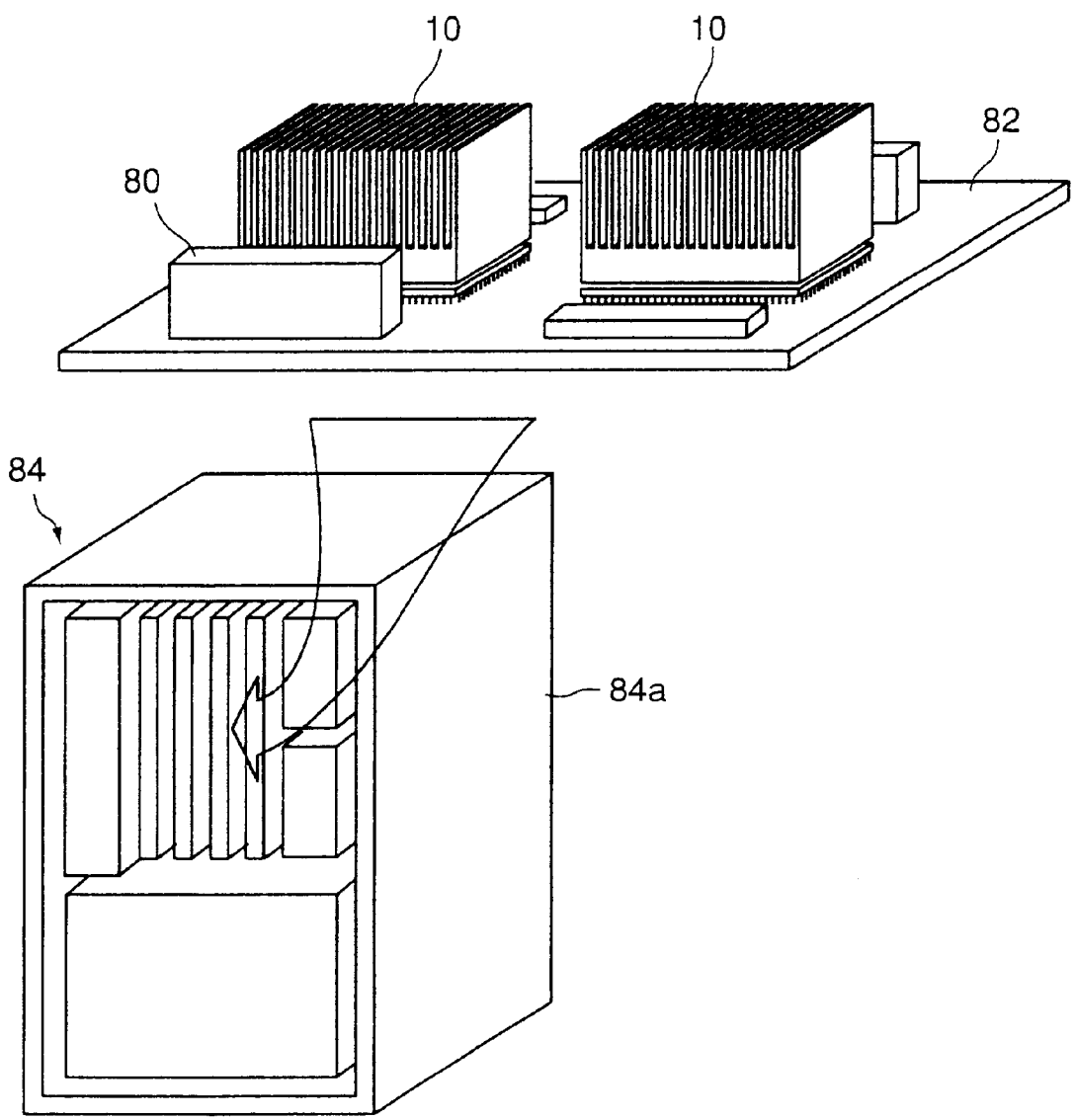
FIG. 7 is a perspective diagram of the inside of a server including the CPU unit of the first embodiment of the present invention.

A description will now be given of a CPU unit 10 of the first embodiment of the present invention loaded in a server 84, with reference to FIG. 7.

A plurality of CPU units 10 are loaded on the motherboard 82 along with a RAM unit 80. Then, a plurality of. the motherboards 82 are loaded in a housing 84a of the server 84 with other electronic components.

Inside the housing 84a, the air is forced to circulate by a cooling fan (not shown on the figure) to cool the CPU unit 10 and other electronic components. In this case, it is possible to efficiently cool the CPU unit 10 because of the improved thermal conductivity.

It is also possible to liquid cool the CPU unit 10 by using a cooling device provided with lines circulating coolant instead of the radiation fins 16b of the CPU unit 10, located outside of the housing 84a.

The present invention is not limited to the specifically disclosed embodiments and variations and modifications may be made without departing from the scope of the present invention.

The present application is based on Japanese Priority Application No. 11-322960 filed on Nov. 12, 1999, the entire contents of which are hereby incorporated by reference.

What is claimed is:

1. A semiconductor unit comprising:
   a substrate;
   a plurality of semiconductor components loaded on the substrate; and
   a cooling device comprising a first hole with an injected compound within the first hole and connecting the cooling device with one of the semiconductor components, wherein the cooling device further comprises: a flat-bottomed dent that is slightly smaller than the connected semiconductor component and communicates with the first hole; and a compound layer formed inside the dent.

2. The semiconductor unit as claimed in claim 1, wherein the compound includes thermally conductive filler.

3. The semiconductor unit as claimed in claim 1, wherein the cooling device further comprises a second hole in communication with the dent.

4. The semiconductor unit as claimed in claim 3, wherein the second hole is provided for discharging residual gas and solvent of the compound.

5. The semiconductor device as claimed in claim 1, further comprising a frame-shaped spacer blocking the compound layer provided in between the connected semiconductor component and the cooling device.

6. A cooling device comprising:
   a member thermally coupled with a semiconductor component; and a first hole in the member with an injected compound in the first hole which connects the member with the semiconductor component, wherein the cooling device further comprises: a flat-bottomed dent that is slightly smaller than the connected semiconductor component and communicates with the first hole; and a compound layer formed inside the-dent.

7. The cooling device as claimed in claim 6, wherein the compound includes thermally conductive filler.

8. The cooling device as claimed in claim 6, wherein the member has a second hole in communication with the dent.

9. The cooling device as claimed in claim 8, wherein the second hole is provided for discharging the residual gas and solvent of the compound.

10. The cooling device as claimed in claim 6, wherein the member comprises detachable radiation fins and a detachable compound injection unit having the first hole.

* * * * *